(12) United States Patent
Huang

(10) Patent No.: US 7,341,899 B2
(45) Date of Patent: Mar. 11, 2008

(54) METHOD OF FABRICATING A THIN FILM TRANSISTOR

(75) Inventor: Tien-Chun Huang, Gueishan Township, Taoyuan County (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 11/335,984

(22) Filed: Jan. 19, 2006

(65) Prior Publication Data

US 2006/0160281 A1    Jul. 20, 2006

(30) Foreign Application Priority Data

Jan. 19, 2005    (TW) .............................. 94101519 A

(51) Int. Cl.
*H01L 21/84* (2006.01)
(52) U.S. Cl. ................ 438/166; 438/149; 257/E21.457
(58) Field of Classification Search ................ 438/149, 438/142, 151, 164, 166
See application file for complete search history.

(56) References Cited

U.S. PATENT DOCUMENTS 4,463,492 A * 8/1984 Maeguchi ................... 438/166
6,174,757 B1 * 1/2001 Yamaguchi et al. ........ 438/166
6,660,574 B1 * 12/2003 Yamazaki ................... 438/149
2002/0115241 A1 * 8/2002 Ando et al. ................. 438/149
2004/0023446 A1 * 2/2004 Fujimura .................... 438/149

* cited by examiner

*Primary Examiner*—Michael Lebentritt
*Assistant Examiner*—Reema Patel
(74) *Attorney, Agent, or Firm*—Thomas, Kayden, Horstemeyer & Risley

(57) ABSTRACT

A method of fabricating a thin film transistor is disclosed. The method comprises forming an amorphous silicon layer overlying a substrate. A first heat treatment is then performed to reduce the hydrogen atom concentration of the amorphous silicon layer. Next, the amorphous silicon layer is patterned to form an island-shaped amorphous silicon pattern. An insulating layer is then formed over the island-shaped amorphous silicon pattern followed by forming a gate electrode on the insulating layer. Ions are then implanted into the island-shaped amorphous silicon pattern to form an ion doped region. A heat treatment is then performed to transfer the island-shaped amorphous silicon pattern into an island-shaped polysilicon pattern and simultaneously activate the ion doped region using laser annealing. A passivation layer is formed on the island-shaped polysilicon pattern followed by etching the passivation layer to form openings exposing the ion doped area.

23 Claims, 5 Drawing Sheets

METHOD OF FABRICATING A THIN FILM TRANSISTOR

BACKGROUND

The invention relates to a thin film transistor (TFT) More particularly, the invention relates to a method of fabricating a thin film transistor (TFT).

Polysilicon thin film transistors have the characteristics of high carrier mobility, low temperature sensitivity and better driving capabilities and such they are applicable to high-speed elements. A liquid crystal display composed of switch elements of polysilicon thin film transistors has the characteristics of fast display, high luminosity, driving and control circuits made on a same board, higher reliability and lower cost. Therefore, polysilicon thin film transistor (TFT) liquid crystal displays have become a trend in development and manufacture.

When annealing amorphous silicon into polysilicon, the annealing temperature is higher than 600° C. For better crystallization, the annealing temperature must be raised to greater than 1000° C. which requires use of a quartz substrate. Quartz substrates, however, are expensive. Thus, less expensive glass substrates are typically substitutes for quartz substrates. Some low temperature polysilicon manufacturing processes (LTPS) for fabricating polysilicon on low-melting glass substrates have been developed. Some methods to reduce glass substrate damage caused by a heat process have also been proposed.

U.S. patent publication number 2004/0023446 discloses a method of manufacturing a thin film transistor and method of manufacturing a flat panel display, thin film transistor, and a flat panel display. An interlayer dielectric layer is formed on a gate electrode by spin coating to avoid disconnection. It is, however, necessary to add a heat process for burning the spin coated interlayer dielectric layer. The publication discloses simultaneously activating the impurity and burning the interlayer dielectric layer through a single heat treatment to reduce substrate damage.

FIG. 1 is a flowchart of a conventional method of forming a thin film transistor. The method comprises steps S30 to S41. First, in step S30, an amorphous silicon layer is formed over a substrate. In step S31, a heat treatment is performed to reduce the hydrogen atom concentration of the amorphous silicon layer. Then, in step S32, excimer laser annealing is performed to transfer the amorphous silicon layer into a polysilicon layer. In step S33, the polysilicon silicon layer is patterned to form an island-shaped polysilicon pattern. Next, step S34 covers an insulating layer over the island-shaped polysilicon pattern. Step S35 forms a gate electrode on the insulating layer. Then, step S36 forms an ion doped region in island-shaped polysilicon pattern. Step S37 performs a hydrogen plasma treatment to eliminate dangling bonds in the island-shaped polysilicon pattern. Next, step S38 forms an interlayer dielectric layer overlying the gate electrode. Step S39 performs a heat treatment to activate the ion doped region and simultaneously burn the interlayer dielectric layer. Step S40 then is selectively etches the interlayer dielectric layer to form an opening exposing the ion doped region. Next, in step S41, a metal layer is filled into the opening to form a source/drain electrode.

In step S37, dangling bonds at the grain boundary of island-shaped polysilicon pattern are reduced by heat treatment. Dangling bonds are, however, again generated spontaneously in channel region during subsequent heat processes such as step S39.

Two heat treatment steps are also respectively performed to reduce hydrogen atom concentration in the amorphous silicon layer and to transfer amorphous silicon into polysilicon, which may result in additional damage to the glass substrate.

SUMMARY

Accordingly, an object of the invention is to provide a method of fabricating a thin film transistor capable of avoiding reproduction of dangling bonds after hydrogen plasma treatment.

Another object of the present invention is to provide a method of fabricating a thin film transistor reducing the number of heat treatment thereby reducing heat impact on the glass substrate A method of fabricating a thin film transistor is provided. An embodiment of a method of fabricating a thin film transistor comprises forming an amorphous silicon layer with a first concentration of hydrogen atom overlying a substrate. A first heat treatment is then performed so that the amorphous silicon layer has a second concentration of hydrogen atom less than the first concentration. Next, the amorphous silicon layer is patterned to form an island-shaped amorphous silicon pattern. An insulating layer is then formed on the island-shaped amorphous silicon pattern followed by forming a gate electrode on the insulating layer. Ions are then implanted into the island-shaped amorphous silicon pattern to form an ion doped region while using the gate electrode as a mask. A second heat treatment is then performed to transfer the island-shaped amorphous silicon pattern into an island-shaped polysilicon pattern and simultaneously activate the ion doped region using laser annealing. The passivation layer is formed overlying the gate electrode. Next, the passivation layer is selectively etched to form openings exposing the ion doped region followed by forming a metal layer filled into the openings to form source/drain electrodes.

An embodiment of a method of fabricating a thin film transistor can further comprise performing a third heat treatment to simultaneously burn the passivation layer and sinter the source/drain electrode, and performing a hydrogen plasma treatment to reduce dangling bonds in the island-shaped polysilicon pattern.

Alternately, an embodiment of the method can further comprise forming an undercoat layer, such as silicon oxide or silicon nitride, before forming the amorphous silicon layer.

DESCRIPTION OF THE DRAWINGS

Methods of fabricating a thin film transistor will become more fully understood from the detailed description given herein below and the accompanying drawings, given by way of illustration only and thus not intended to be limitative of the invention.

DETAILED DESCRIPTION

An embodiment of a method of fabricating thin film transistors will be described in greater detail in the following.

Figure 1:
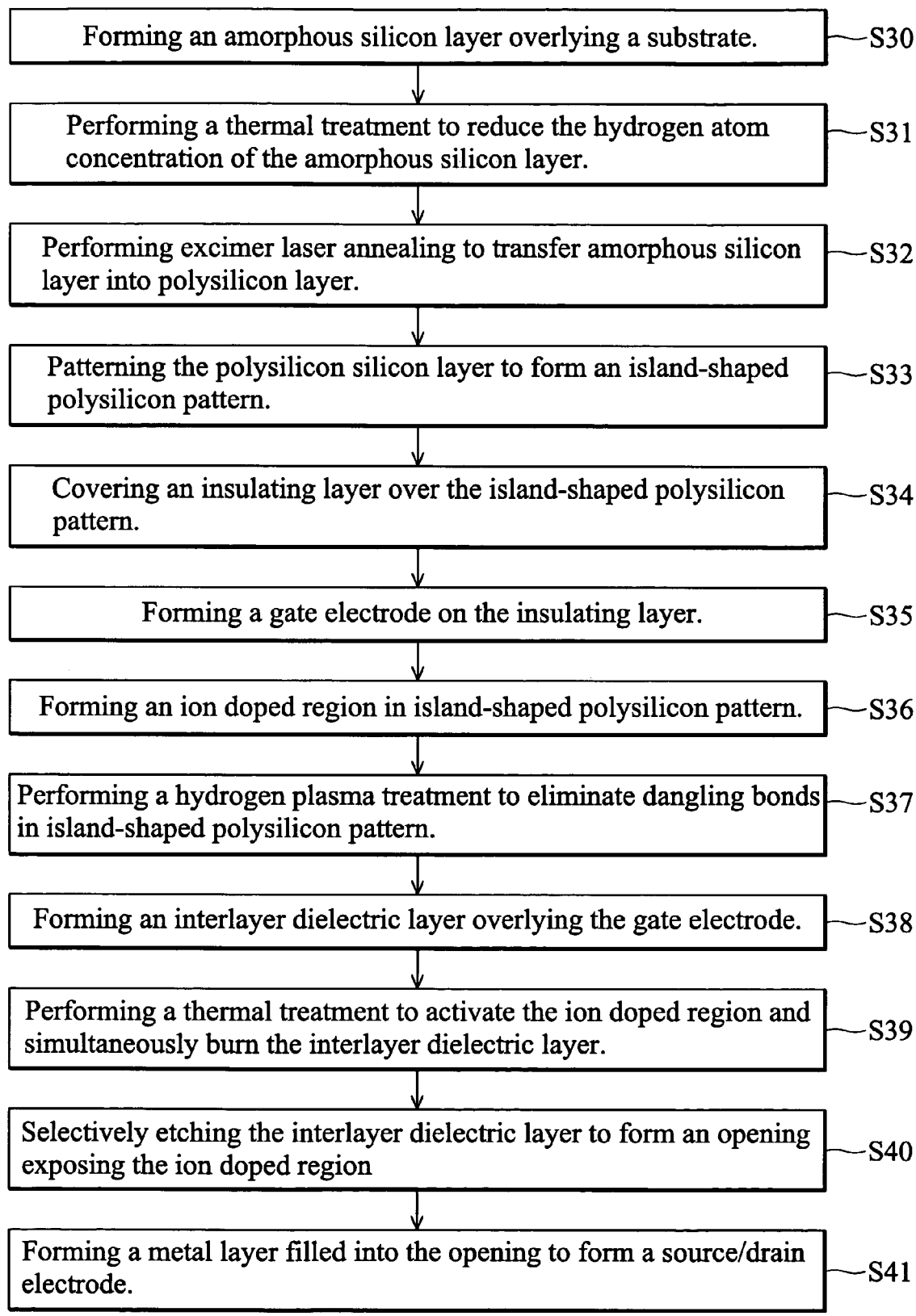
FIG. 1 is a flowchart of a conventional method of fabricating a thin film transistor.
Figure 2A:
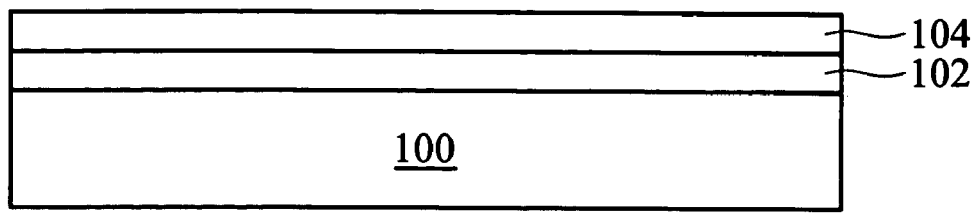
FIGS. 2a to 2h are cross-sectional views of an embodiment of a method of fabricating a thin film transistor.

As shown in FIG. 2a, an undercoat layer 102, comprising silicon oxide or silicon nitride or a composite layer of silicon oxide or silicon nitride, is preferably formed by chemical vapor deposition on a substrate 100. The undercoat layer 102 may prevent implanted ions from diffusion into the substrate 100 or prevent diffusion of impurities in the substrate into the channel region in subsequent processes. The substrate 100 may comprise an alumino silicate glass or quartz material.

Next, an amorphous silicon layer 104, having a thickness of 500 angstroms to 2000 angstroms, preferably 500 angstroms, is formed over the substrate 100 having the undercoat layer 102 by plasma-enhanced chemical vapor deposition (PECVD) to be a precursor layer. The amorphous silicon layer 104 may have about 10 to 12 percent by mole of hydrogen atoms.

Then, the substrate 100 having amorphous silicon layer 104 is subjected to a first heat treatment, dehydrogenation, so that the amorphous silicon layer 104 has less than 4 percent by mole of hydrogen atoms. In an embodiment, the hydrogen concentration in the amorphous silicon layer 104 may be less than 12 percent by mole and greater than 4 percent by mole. The first heat treatment may be performed using a furnace at a temperature of about 350° C. to 500° C. for 0.5 to 2 hours, preferably 1 hour.

Figure 2B:
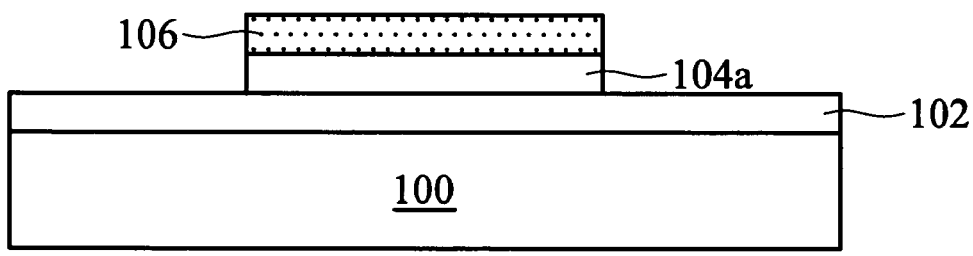

Turning now to FIG. 2b, the amorphous silicon layer 104 is patterned to form an island-shaped amorphous silicon pattern 104a. The patterning method is described as follows. A photoresist pattern 106 is formed by photolithography. The amorphous silicon layer 104 is dry etched using the photoresist pattern 106 as an etching mask to form the island-shaped amorphous silicon pattern 104a mentioned above.

Figure 2C:
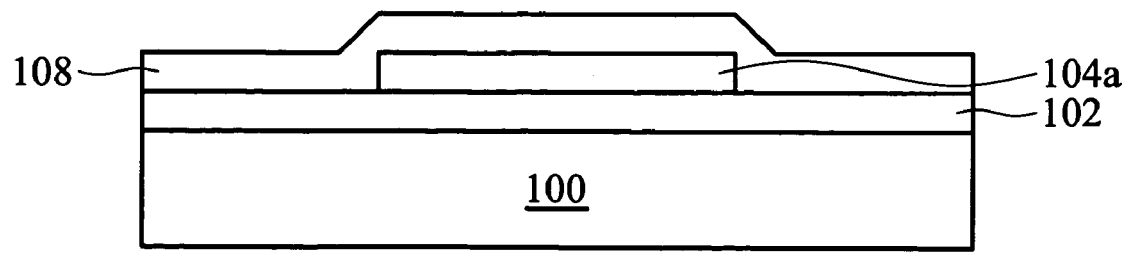

Referring to FIG. 2c, the photoresist pattern 106 is stripped. Then, an insulating layer 108, for example silicon oxide layer, is formed on the island-shaped amorphous silicon pattern 104a and the undercoat layer 102 using plasma-enhanced chemical vapor deposition (PECVD).

Figure 2D:
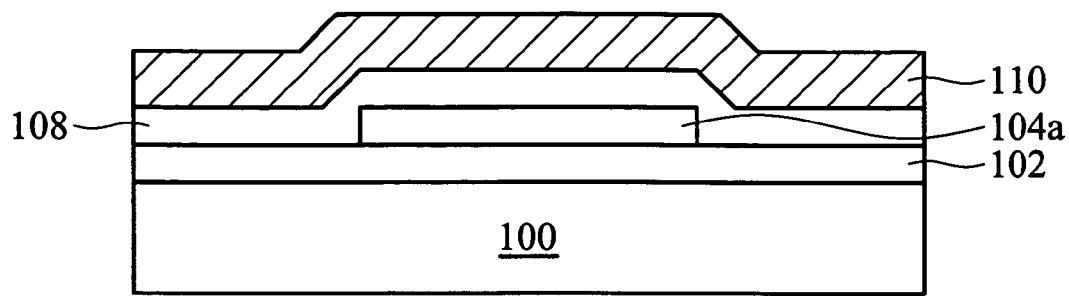

Next, as shown in FIG. 2d, a conductive layer 110, having a thickness of about 200 nm to 300 nm, is deposited on the insulating layer 108 by physical vapor deposition or sputtering. The conductive layer 110 may comprise a metal selected from a group consisting of Al, Ti, Ta and Mo or a combination thereof. That is, the conductive layer 110 may comprise Al, Ti, Ta, Mo, at least one of their alloys or a composite layer thereof.

Figure 2E:
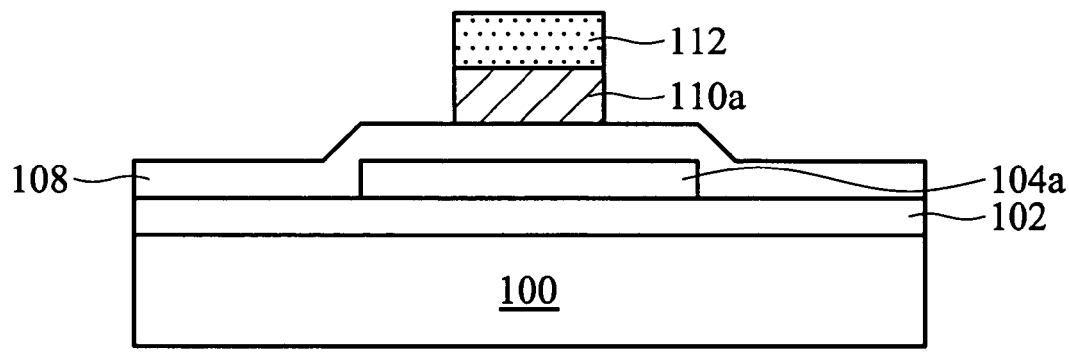

As shown in FIG. 2e, a gate electrode 110a is then formed on the insulating layer 108. The formation method is described in the following. A photoresist pattern 112 is formed on the conductive layer 110. The conductive layer 110 is then dry etched using the photoresist pattern 112 as an etching mask to form the gate electrode 110a mentioned above.

Figure 2F:
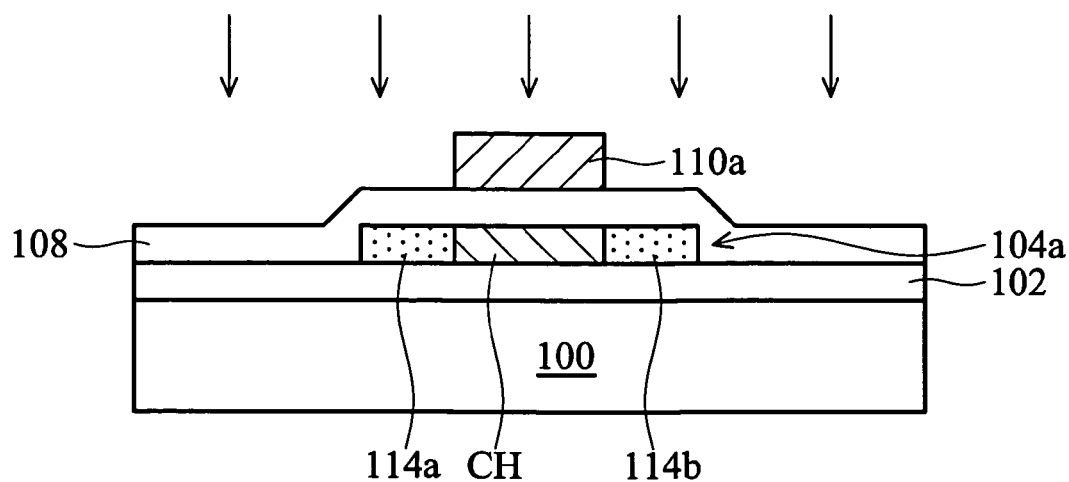

Referring now to FIG. 2f, the photoresist pattern 112 is then stripped with wet chemistries or plasma technologies. Ions (dopants or impurities) are implanted into the island-shaped amorphous silicon pattern using the gate electrode 110a as a mask to form ion doped regions 114a and 114b. In this step, a $B_2H_6$ containing gas is introduced into a chamber of an implantation machine and ionized to boron ions (p-type ions) followed by implanting into island-shaped amorphous silicon pattern 104a through the insulating layer 108 so that ion doped regions 114a and 114b spaced apart by an undoped channel CH are formed. Alternately, $PH_3$ containing gas may be introduced into the chamber of an implantation machine and ionized to phosphorus ions (n-type ions) followed by implanting into island-shaped amorphous silicon pattern 104a through the insulating layer 108. The ion doped region 114a and 114b are spaced apart by an undoped channel CH.

The substrate 100 having the island-shaped amorphous silicon pattern 104a and the ion doped regions 114a and 114b is subjected to a second heat treatment (heat annealing) to transfer the island-shaped amorphous silicon pattern 104a into an island-shaped polysilicon pattern 104b and simultaneously activate the ion doped regions 114a and 114b thereby having better electrical conductivity. The second heat treatment may be performed by an excimer laser using a wavelength of 308 nm (XeCl) about several minutes, such as 1 to 10 minutes. Alternately, the second heat treatment may be performed by a krF or ArF excimer laser. Alternately, the second heat treatment may be carried out by rapid heat annealing (RTA) for about several minutes such as 1 to 10 minutes.

The second heat treatment transfers the island-shaped amorphous silicon pattern 104a into an island-shaped polysilicon pattern 104b and simultaneously activates the ion doped regions 114a and 114b. Therefore, the number of heat treatment can be reduced thereby reducing heat impact such as cracks on the substrate such as a glass substrate.

Figure 2G:
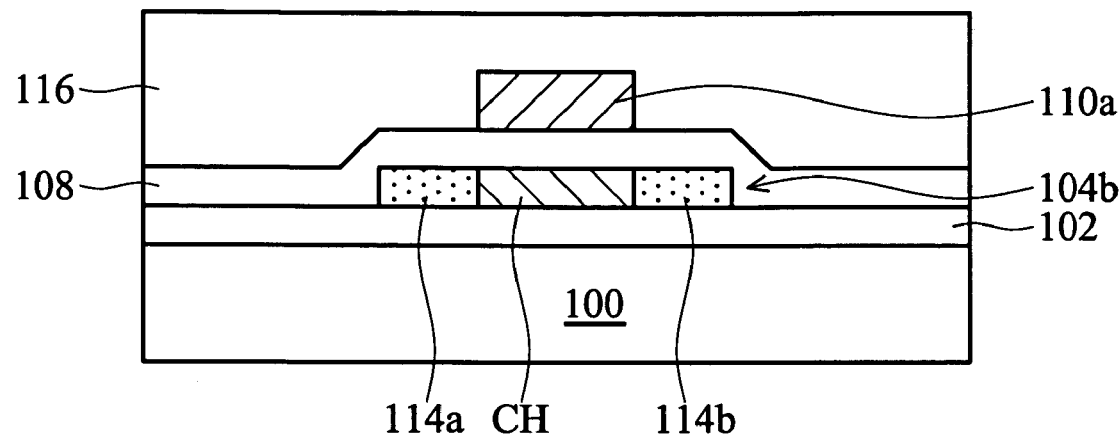

As shown in FIG. 2g, a passivation layer 116, having a thickness of about 400 nm to 500 nm, is formed on the insulating layer 108 and the gate electrode 110a by plasma enhanced chemical vapor deposition or spin coating. The passivation layer 116 may comprise silicon and oxide containing organic insulating material or inorganic material.

Figure 2H:
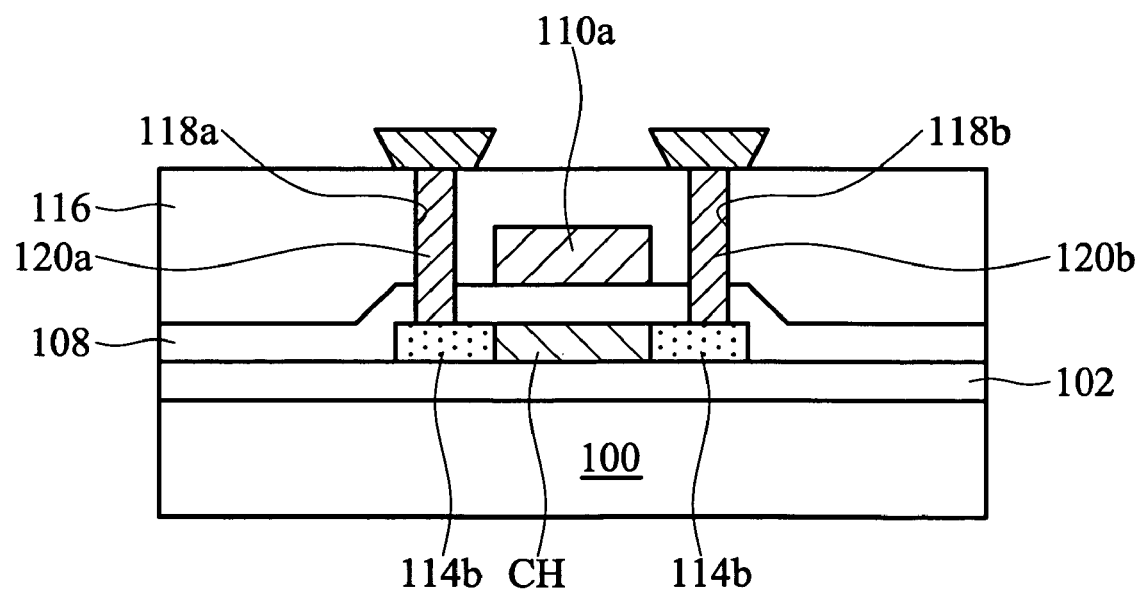

Next, as shown in FIG. 2h, the passivation layer 116 is selectively etched to form openings 118a, 118b exposing the ion doped regions 114a and 114b. The etching step is described as follows. A photoresist pattern (not shown) is formed on the passivation layer 116. The passivation layer 116 is then etched using the photoresist pattern as a mask to form openings 118a, 118b. A metal layer is then globally deposited on the passivation layer 116 and filled into the openings 118a, 118b. The metal layer is patterned by photolithography and etching to form source/drain electrodes 120a and 120b and a signal line (not shown). The metal layer may comprise Al, Al alloy, tungsten silicide ($WSi_x$), or titanium silicide ($TiSi_y$).

Subsequently, the substrate 100 having source/drain electrodes 120a and 120b is subjected to a third heat treatment, to simultaneously burn the passivation layer 116 and sinter the source/drain electrodes 120a, 120b comprising metal in order to reduce the contact resistance of source/drain electrodes 120a, 120b. The third heat treatment may be performed at a temperature of about 350° C. to 500° C. for 0.5 to 1 hr using a furnace. The third heat treatment burns the passivation layer 116 and simultaneously sinters the source/drain electrode 120a, 120b. Therefore, the number of heat treatments can be reduced thereby reducing heat impact such as cracks on the substrate.

Then, to eliminate or reduce dangling bonds of the island-shaped polysilicon pattern 104b, a hydrogen plasma treatment is preferably carried out by a plasma-enhanced chemical vapor deposition machine. The hydrogen plasma treatment is carried out after formation of source/drain electrodes 120a, 120b. Compared to the conventional process, dangling bonds are not easily reproduced in the channel during subsequent heat treatment.

An insulating layer (not shown) is deposited on the source/drain electrodes 120a, 120b followed by formation of a pixel electrode comprising transparent conductive material such as indium tin oxide (ITO) thereby forming a thin film transistor display.

Figure 3:
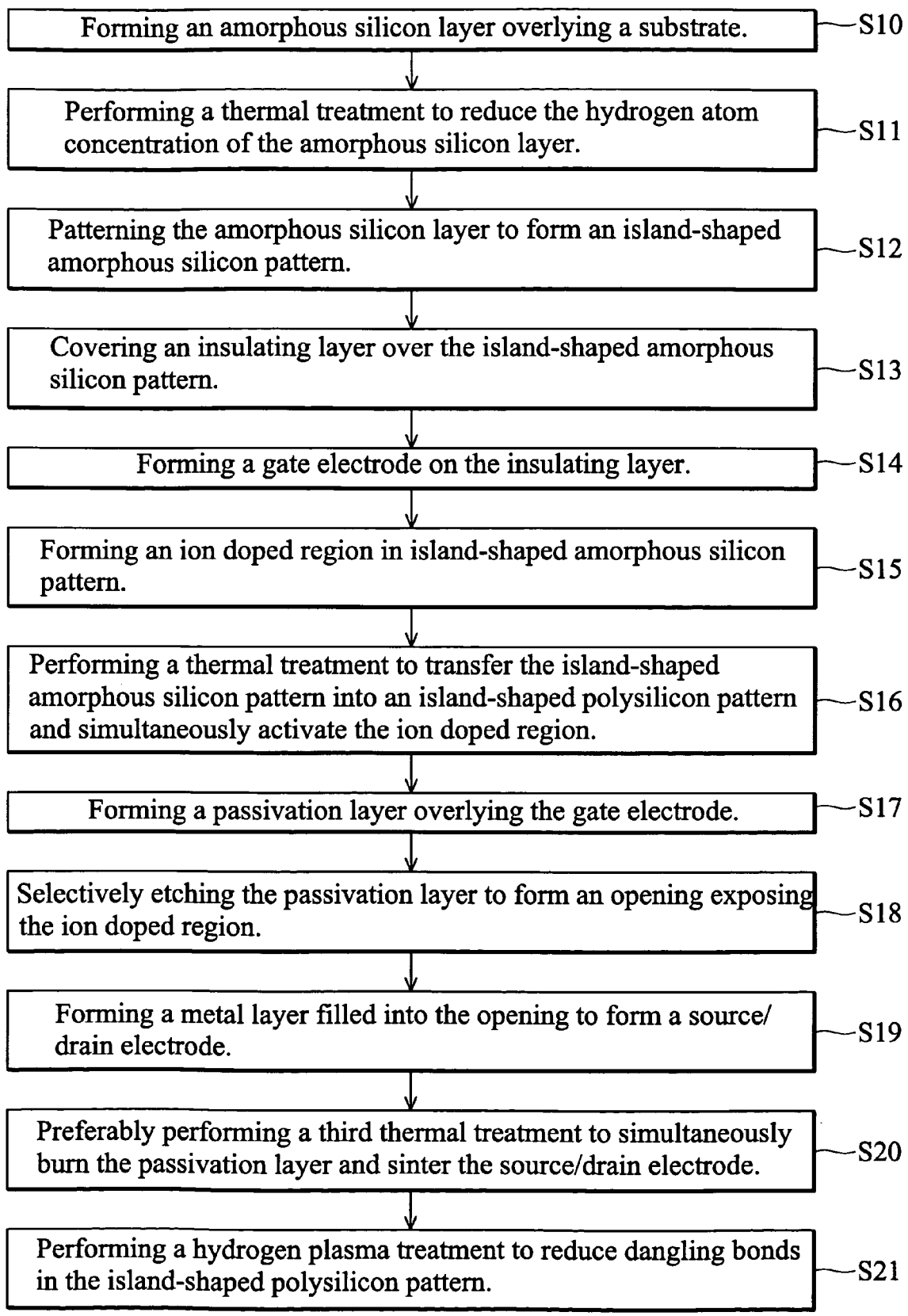
FIG. 3 is a flowchart of an embodiment of a method of fabricating a thin film transistor.

As shown in FIG. 3, a flowchart of an embodiment of a method of fabricating a thin film transistor is illustrated. The method comprises steps S10 to S21. First, step S10 forms an amorphous silicon layer overlying a substrate. Step S11 performs a heat treatment to reduce the hydrogen atom concentration of the amorphous silicon layer. Then, step S12 patterns the amorphous silicon layer to form an island-shaped amorphous silicon pattern. Next, step S13 covers an insulating layer over the island-shaped amorphous silicon pattern. Step S14 forms a gate electrode on the insulating layer. Then, Step S15 forms an ion doped region in island-shaped amorphous silicon pattern. Step S16 performs a heat treatment to transfer the island-shaped amorphous silicon pattern into an island-shaped polysilicon pattern and simultaneously activate the ion doped region. Step S17 forms a passivation layer overlying the gate electrode. Step S18 selectively etches the passivation layer to form openings exposing the ion doped region. Next, in step S19, a metal layer is filled into the openings to form source/drain electrodes. Step S20 preferably performs a third heat treatment to simultaneously burn the passivation layer and sinter the source/drain electrode. Then, step S21 performs a hydrogen plasma treatment to reduce dangling bonds in the island-shaped polysilicon pattern.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method of fabricating a thin film transistor, comprising:
    forming an amorphous silicon layer, with a first concentration of hydrogen atoms, over a substrate;
    performing a first heat treatment so that the amorphous silicon layer has a second concentration of hydrogen atoms less than the first concentration;
    patterning the amorphous silicon layer to form an island-shaped amorphous silicon pattern;
    depositing an insulating layer over the island-shaped amorphous silicon pattern;
    forming a gate electrode on the insulating layer;
    implanting ions into the island-shaped amorphous silicon pattern to form an ion doped region while using the gate electrode as a mask;
    performing a second heat treatment to transfer the island-shaped amorphous silicon pattern into an island-shaped polysilicon pattern and simultaneously activate the ion doped region using laser annealing;
    forming a passivation layer over the gate electrode;
    selectively etching the passivation layer to form openings exposing the ion doped region;
    filling a metal layer into the openings to form source/drain electrodes;
    performing a third heat treatment to simultaneously burn the passivation layer and sinter the source/drain electrode; and
    performing a hydrogen plasma treatment to reduce dangling bonds in the island-shaped polysilicon pattern after third heat treatment.

2. The method of fabricating a thin film transistor as claimed in claim 1, further comprising forming an undercoat layer before forming the amorphous silicon layer.

3. The method of fabricating a thin film transistor as claimed in claim 2, wherein the undercoat layer is formed of a silicon nitride layer or a silicon oxide layer on the substrate by chemical vapor deposition.

4. The method of fabricating a thin film transistor as claimed in claim 1, wherein the amorphous silicon layer is formed by chemical vapor deposition.

5. The method of fabricating a thin film transistor as claimed in claim 1, wherein the first heat treatment is performed by furnace for 0.5 to 2 hours.

6. The method of fabricating a thin film transistor as claimed in claim 5, wherein the first heat treatment is performed at a temperature of 350° C. to 500° C.

7. The method of fabricating a thin film transistor as claimed in claim 1, wherein the insulating layer is formed of a silicon oxide layer on the island-shaped amorphous silicon pattern by plasma enhanced chemical vapor deposition.

8. The method of fabricating a thin film transistor as claimed in claim 1, wherein the formation of the gate electrode further comprises:
    forming a conductive layer on the insulating layer; and
    patterning the conductive layer to form the gate electrode.

9. The method of fabricating a thin film transistor as claimed in claim 8, wherein the conductive layer is selected from a group consisting of Al, Ti, Ta and Mo or combination thereof.

10. The method of fabricating a thin film transistor as claimed in claim 8, wherein the conductive layer has a thickness of 200 nm to 300 nm.

11. The method of fabricating a thin film transistor as claimed in claim 1, wherein the ions are p-type ions.

12. The method of fabricating a thin film transistor as claimed in claim 1, wherein the ions are n-type ions.

13. The method of fabricating a thin film transistor as claimed in claim 1, wherein the second heat treatment is performed by an excimer laser using a wavelength of 308 nm (XeCl).

14. The method of fabricating a thin film transistor as claimed in claim 1, wherein the second heat treatment is performed by an excimer laser using KrF or ArF.

15. The method of fabricating a thin film transistor as claimed in claim 1, wherein the passivation layer is formed by spin coating.

16. The method of fabricating a thin film transistor as claimed in claim 1, wherein the passivation layer is organic material.

17. The method of fabricating a thin film transistor as claimed in claim 1, wherein the passivation layer is inorganic material.

18. The method of fabricating a thin film transistor as claimed in claim 1, wherein the passivation layer is selectively etched by forming a photoresist pattern; and
    etching the passivation layer using the photoresist pattern as a mask until the openings exposing the ion doped region are formed.

19. The method of fabricating a thin film transistor as claimed in claim 1, wherein the metal layer is formed of Al, Al alloy, tungsten silicide or titanium silicide.

20. The method of fabricating a thin film transistor as claimed in claim 1, wherein the formation of the metal layer further comprises:
    sputtering a metal layer; and
    selectively etching the metal layer to form the source/drain electrodes and a signal line.

21. The method of fabricating a thin film transistor as claimed in 1, wherein the third heat treatment is performed at a temperature of 350° C. to 500° C.

22. The method of fabricating a thin film transistor as claimed in claim 1, wherein the third heat treatment is performed for 0.5 to 1 hours.

23. The method of fabricating a thin film transistor as claimed in claim 1, wherein the hydrogen plasma treatment is performed by plasma enhanced chemical vapor deposition apparatus.

* * * * *